(12) United States Patent
Sugihara et al.

(10) Patent No.: US 7,015,107 B2
(45) Date of Patent: Mar. 21, 2006

(54) METHOD OF MANUFACTURING SEMICONDUCTOR DEVICE

(75) Inventors: Kohei Sugihara, Tokyo (JP); Hirokazu Sayama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 357 days.

(21) Appl. No.: 10/243,742

(22) Filed: Sep. 16, 2002

(65) Prior Publication Data

US 2003/0170958 A1 Sep. 11, 2003

(30) Foreign Application Priority Data

Mar. 5, 2002 (JP) .................................... 2002-058852

(51) Int. Cl.
*H01L 21/336* (2006.01)

(52) U.S. Cl. .................. 438/305; 438/303; 438/257
(58) Field of Classification Search ................ 438/296, 438/585, 303, 305, 257
See application file for complete search history.

(56) References Cited

U.S. PATENT DOCUMENTS

| | | | | |
|---|---|---|---|---|
| 5,770,506 A | * | 6/1998 | Koh ........................... | 438/303 |
| 5,770,508 A | * | 6/1998 | Yeh et al. ................... | 438/305 |
| 6,054,355 A | * | 4/2000 | Inumiya et al. ............. | 438/296 |
| 6,137,149 A | | 10/2000 | Kodama | |
| 6,174,771 B1 | * | 1/2001 | Leu ............................ | 438/257 |
| 6,335,252 B1 | | 1/2002 | Oishi et al. ................. | 438/303 |
| 6,512,266 B1 | * | 1/2003 | Deshpande et al. ......... | 438/585 |

FOREIGN PATENT DOCUMENTS

| | | |
|---|---|---|
| JP | 10-12879 | 1/1998 |
| JP | 2001-168323 | 6/2001 |

OTHER PUBLICATIONS

K. Tsuji, et al., "High Performance 50–nm Physical Gate Length pMOSFETs by Using Low Temperature Activation by Re–Crystallization Scheme", Symposium on VLSI Technology Digest of Technical Papers, 1999, pp. 9–10.

E. Morifuji, et al., "An 80nm Dual–Gate CMOS with Shallow Extensions Formed After Activation Annealing and Salicide", IEEE, 1999, pp. 648–653.

Bin Yu, et al., 70nm MOSFET with Ultra–Shallow, Abrupt, and Super–Doped S/D Extension Implemented by Laser Thermal Process (LTP), IEEE, 1999, pp. 508–513.

H. Wakabayashi, et al., "45–nm Gate Length CMOS Technology and Beyond Using Steep Halo", IEEE, 2000, pp. 48–53.

* cited by examiner

*Primary Examiner*—John F. Niebling
*Assistant Examiner*—Walter L. Lindsay, Jr.
(74) *Attorney, Agent, or Firm*—Oblon, Spivak, McClelland, Maier & Neustadt, P.C.

(57) ABSTRACT

When a dummy sidewall and source and drain regions are once formed and then the dummy sidewall is removed to extend the source and drain regions, the removal of the dummy sidewall is performed after formation of a protective oxide film on a gate electrode and on the major surfaces of the source and drain regions. This efficiently prevents conventional surface roughness of the upper surface of the gate electrode and the impurity region due to the removal of the dummy sidewall.

10 Claims, 17 Drawing Sheets

F / G. 6
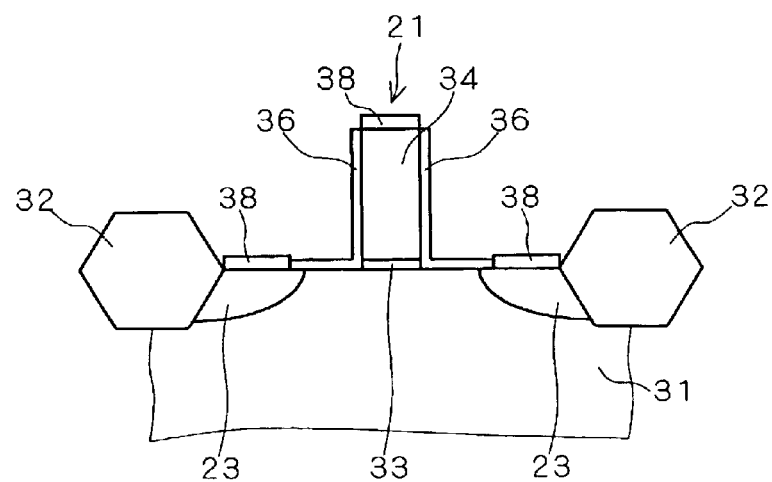
F / G. 7
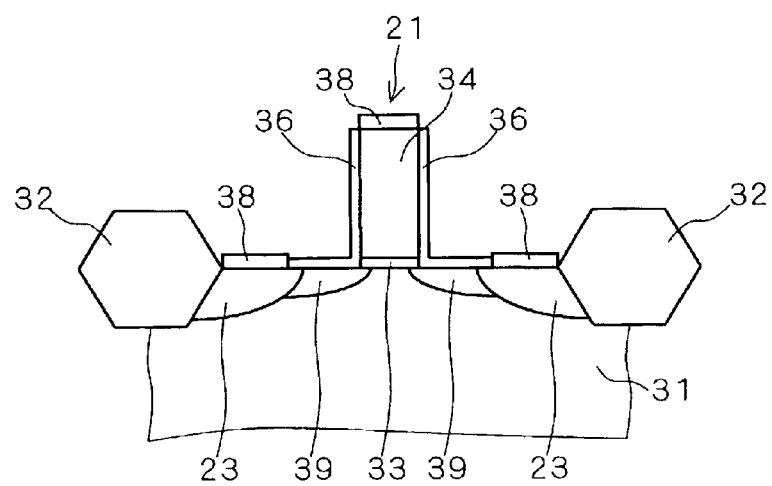

METHOD OF MANUFACTURING SEMICONDUCTOR DEVICE

BACKGROUND OF THE INVENTION

1. Field of the Invention

The present invention relates to a method of manufacturing a semiconductor device having an MIS (Metal-Insulator-Semiconductor) structure.

2. Description of the Background Art

Improvements in both short channel characteristics and drive capability of MOSFETs are becoming increasingly difficult as device dimensions shrink. As a method to resolve this problem, a replacement sidewall technique has been suggested (in, for example, Japanese Patent Application Laid-open No. 2000-168323). The replacement sidewall technique is a technique for removing a sidewall after deep source/drain (deep S/D) implantation and activation annealing and then performing extension implantation and activation annealing for extension. This technique aims to resolve the problem of a conventional process that heat required for activation of deep S/D is applied also to extensions, and to satisfy both shallow junctions and low parasitic resistance.

In the replacement sidewall process, it is essentially preferable that a sidewall has a $SiN/SiO_2$ multilayer structure. This is because, in the case of a $SiO_2$ single-layer structure, an isolation oxide film also is etched at the time of removal of a sidewall, which arouses concern that an isolation region might recede significantly and thereby junction leakage properties might be worsened. In the case of the $SiN/SiO_2$ multilayer structure, on the other hand, the $SiO_2$ sidewall is thinner than in the case of the single-layer structure, and the gate edge is to be etched as well.

FIGS. 35 to 41 are schematic diagrams illustrating a process sequence of conventional MOSFET fabrication.

<Element Isolation Process>

FIG. 35 shows a cross-section after completion of an element isolation process. On the major surface of a semiconductor substrate 1, an isolation oxide film 2 is formed for element isolation. The isolation oxide film 2 sections an element region of the semiconductor substrate 1. The isolation oxide film 2 may adopt trench isolation. In the structure shown in FIG. 35, well and channel are formed by impurity implantation. The well and channel, however, have no direct relation to the replacement sidewall process and thus not shown herein.

<Gate Insulating Film Formation Process>

The element region of the semiconductor substrate 1 is subjected to gate oxidation.

<Gate Electrode Deposition Process>

A polysilicon layer is formed on the upper surface of a film produced by the gate oxidation.

<Gate Electrode Formation Process>

A resist is applied to a predetermined area of the upper surface of the polysilicon layer and a mask pattern of a gate electrode is transferred and developed. Polysilicon and oxide film are then etched (referred to as "gate etching") to form a gate electrode 3 as shown in FIG. 36. The gate electrode 3 is formed of a gate insulating film 4 and a polysilicon layer 5.

<Dummy Sidewall Formation Process>

A dummy sidewall 6 (eventually to be removed) is formed as shown in FIG. 37. In the present example, the dummy sidewall 6 of a multilayer structure is formed by depositing an oxide film 7 and then a nitride film 8 on the whole surfaces of the gate electrode 3 and the semiconductor substrate 1 and etching back the films.

<Source and Drain Formation Process>

Source and drain regions 9 (FIG. 38) are formed by ion implantation. This process is performed individually for NMOS and PMOS structures, for example by covering either one of the structures with a resist. Following this, thermal processing is performed to activate implanted impurities.

<Dummy Sidewall Processing Process>

The nitride film 8 of the dummy sidewall 6 shown in FIGS. 37 and 38 is etched using phosphoric acid and completely removed (FIG. 39). After that, the oxide film 7 of the dummy sidewall 6 may be removed and reoxidation (referred to as "gate reoxidation") may be performed for protection of the gate insulating film 4 at the gate edge.

<Source and Drain Extension Process>

In the structure shown in FIG. 39, source and drain extension regions 10 are formed (FIG. 40). This process is performed individually for NMOS and PMOS structures, for example by covering either one of the structures with a resist. Following this, thermal processing is performed to activate implanted impurities.

<Sidewall Formation Process>

A sidewall 11 is formed as shown in FIG. 41, for example by depositing and etching a nitride film 18 on the whole surface.

<Silicide Process>

A metal such as cobalt or titanium is deposited to form a silicide layer on the upper surfaces of the source and drain regions 9 and the gate electrode 3.

<Interlayer Film Formation Process>

Thereafter, an interlayer film, interconnections and the like are formed according to an ordinary semiconductor integrated circuit manufacturing method.

A sidewall of the $SiN/SiO_2$ multilayer structure has another problem in that Si-exposed source/drain and gate have surface roughness, which is schematically illustrated with triangles in FIGS. 39 to 41. This is because phosphoric acid, which is commonly used in wet etching for removal of a SiN film, removes also a Si film (especially an impurity-doped Si film).

This surface roughness inhibits proper formation of silicide such as CoSi or TiSi and thus can become a cause of an abnormal increase in junction leakage current. Further, if silicide such as CoSi or TiSi is not formed properly and a pin hole is formed in the gate, for example, Co or Ti that was left without silicide formation will reach the gate insulating film, leading to degradation in the reliability of the gate insulating film.

SUMMARY OF THE INVENTION

An object of the present invention is to provide a method of manufacturing a semiconductor device which, by forming a protective oxide film, can prevent surface roughness of a semiconductor substrate and a gate electrode due to phosphoric acid and can achieve both reductions in junction leakage current (low power consumption) and improvements in the reliability of a gate oxide film (high reliability), without losing original advantages of a replacement sidewall process.

According to the present invention, the method of manufacturing a semiconductor device includes the following steps (a) to (f). The step (a) is to form a gate insulating film on a major surface of a semiconductor substrate and a gate electrode on the semiconductor substrate through the gate insulating film. The step (b) is to form a dummy sidewall to cover side surfaces of the gate electrode and the gate insulating film and a predetermined area of the major surface which extends laterally from the side surfaces. The step (c) is to form an impurity region by introducing an impurity into the major surface using the dummy sidewall and the gate electrode as masks. The step (d) is to form a protective oxide film on an upper surface of the gate electrode and on the major surface using the dummy sidewall as a mask and is performed either prior to or after the step (c). The step (e) is to reduce a thickness of the dummy sidewall and is performed after the step (d). The step (f) is to extend the impurity region under part of the gate insulating film using a dummy sidewall left after the step (e) and the gate electrode as masks.

When the dummy sidewall and the impurity region are once formed and then the dummy sidewall is removed to extend the impurity region, the removal of the dummy sidewall is performed after formation of a protective film on the gate electrode and on the major surface of the impurity region or semiconductor substrate. This efficiently prevents conventional surface roughness of the upper surface of the gate electrode and the impurity region due to the removal of the dummy sidewall. By avoiding surface roughness of the semiconductor substrate and the gate electrode, both reductions in junction leakage current (low power consumption) and improvements in the reliability of the gate insulating film (high reliability) can be achieved without losing original advantages of the replacement sidewall process (e.g. suppression of short channel effect and improvements in drive capability).

Preferably, the step (d) is performed after the step (b) and prior to the step (c).

Since heat of protective oxidation is not applied to the impurity region introduced by impurity implantation and also impurities in the impurity region and the gate electrode are activated in a later step, compatibility between suppression of impurity diffusion and an increase in the rate of activation can be increased with ease. By in this way, preventing excess impurity diffusion in, for example, the source and drain regions, it is possible to prevent a reduction in threshold voltage and an increase in variation of threshold voltage due to a deterioration in short channel characteristics and excess impurity diffusion in the gate electrode (caused by surface roughness of the gate insulating film due to gate impurities).

Preferably, the method of manufacturing a semiconductor device further includes the step (g) of accelerating oxidation by implanting an impurity into the gate electrode and the major surface using the dummy sidewall as a mask. The step (g) is performed after the step (b) and prior to the step (d).

Since, by executing the step (g), the protective oxide film of a predetermined film thickness can be formed in short time in the step (d), excess impurity diffusion in the impurity region and in the gate electrode can be suppressed. By in this way, preventing excess impurity diffusion in, for example, the source and drain regions, it is possible to prevent a reduction in threshold voltage and an increase in variation of threshold voltage due to a deterioration in short channel characteristics and excess impurity diffusion in the gate electrode (caused by surface roughness of the gate insulating film due to gate impurities). Besides, channel impurity diffusion can also be suppressed, which makes it easy to form an advanced channel structure.

Preferably, the method of manufacturing a semiconductor device further includes the step (h) of raising the major surface by epitaxial growth using the dummy sidewall and the gate electrode as masks. The step (h) is performed after the step (b) and prior to the step (d). In the step (d), a protective oxide film is formed on a structure obtained by the step (h), using the dummy sidewall as a mask.

Since the protective oxide film is formed after raising the impurity region or the major surface by epitaxial growth, only raised portions are eroded and the semiconductor substrate and the like are protected from erosion.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a schematic diagram illustrating a dummy sidewall processing process in the semiconductor device manufacturing method according to the first preferred embodiment of the present invention;

FIG. 7 is a schematic diagram illustrating a source and drain extension process in the semiconductor device manufacturing method according to the first preferred embodiment of the present invention;

DESCRIPTION OF THE PREFERRED EMBODIMENTS

<First Preferred Embodiment>

FIGS. 1 to 8 are schematic diagrams illustrating a process sequence of a semiconductor device manufacturing method according to a first preferred embodiment of the present invention. According to this semiconductor device manufacturing method, as shown in FIGS. 1 to 8, after formation of a gate electrode 21, a dummy sidewall 22 and source and drain regions (impurity regions) 23, oxidation of the gate electrode 21 and the source and drain regions 23 is performed for protection and then a nitride film as a material of the dummy sidewall 22 is removed. Thereby surface roughness of the gate electrode 21 and the source and drain regions 23 can be prevented. Hereinbelow, the manufacturing method will be described in more detail.

<Element Isolation Process>

Figure 1:
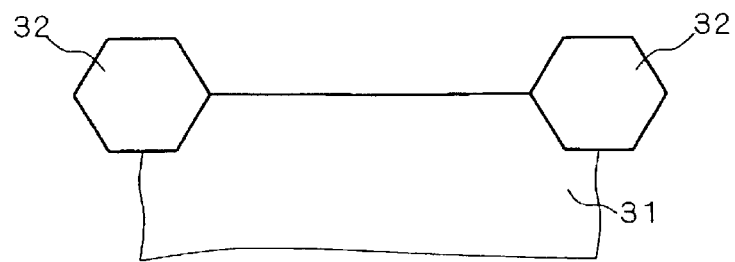
FIG. 1 is a schematic diagram illustrating an element isolation process in a semiconductor device manufacturing method according to a first preferred embodiment of the present invention.

FIG. 1 shows a cross-section after completion of an element isolation process. On the major surface of a semiconductor substrate 31, an isolation oxide film 32 is formed for element isolation. The isolation oxide film 32 sections an element region of the semiconductor substrate 31. The isolation oxide film 32 may adopt trench isolation. In the structure shown in FIG. 1, well and channel are formed by impurity implantation. The well and channel, however, have no direct relation to the present invention and thus not shown herein.

<Gate Insulating Film Formation Process>

A gate insulating film 33 of oxide film having a thickness of 0.5 to 9 nm is formed on the major surface of the element region of the semiconductor substrate 31. Instead of oxide film, oxynitride film or any other material having high permittivity may be used. Or, the effective film thickness of the gate insulating film 33 on an oxide film basis may be changed according to gate breakdown voltage.

<Gate Electrode Deposition Process>

A polysilicon layer 34 is formed on the gate insulating film 33. The polysilicon layer 34 has a film thickness of, for example, 50 to 200 nm. Instead of the polysilicon layer 34, polysilicon germanium or a multilayer structure of polysilicon germanium and polysilicon may be used. The polysilicon layer 34 may be formed by using phosphorous-doped polysilicon, or it may be formed by depositing undoped polysilicon and then implanting ions such as phosphorous for formation of an NMOS transistor and boron for formation of a PMOS transistor. At this time, such ion implantation is not an absolute necessity. During the implantation, areas not to be ion implanted are masked with a photoresist which is then removed after completion of the implantation. The concentration of implanted impurities ranges, for example from $1\times10^{19}$ to $1\times10^{21}$ cm$^{-3}$.

<Gate Electrode Formation Process>

Figure 2:
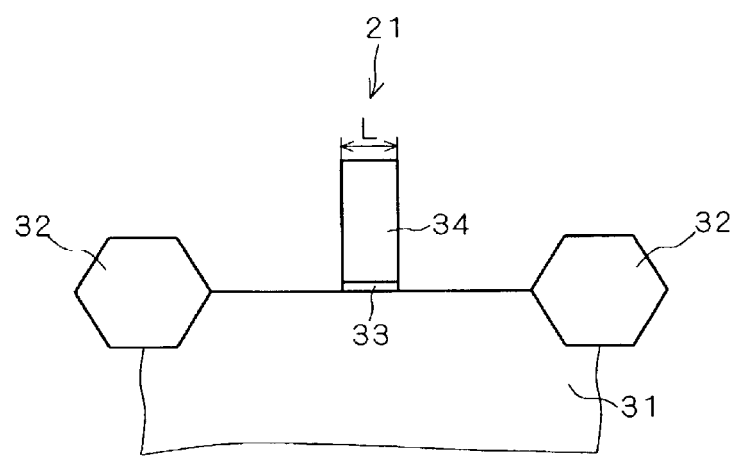
FIG. 2 is a schematic diagram illustrating a gate electrode formation process in the semiconductor device manufacturing method according to the first preferred embodiment of the present invention.

A resist is applied and a mask pattern of a gate electrode 21 is transferred and developed. Polysilicon is then anisotropically etched using a residual resist as a mask, whereby the gate electrode 21 as shown in FIG. 2 is formed. A typical gate length herein ranges from 0.015 to 0.10 $\mu$m.

<Dummy Sidewall Formation Process>

Figure 3:
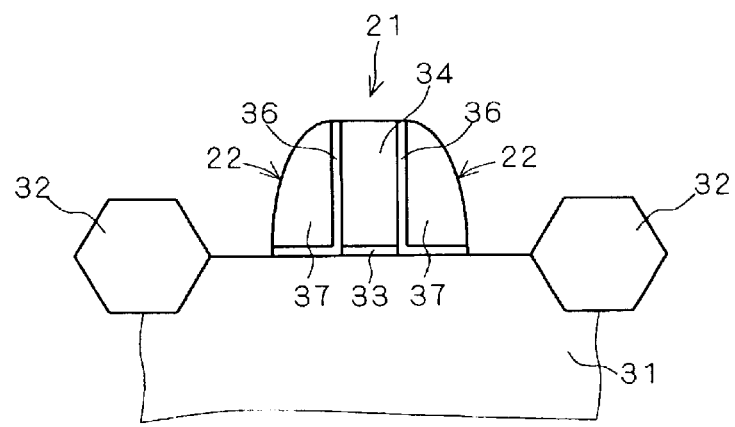
FIG. 3 is a schematic diagram illustrating a dummy sidewall formation process in the semiconductor device manufacturing method according to the first preferred embodiment of the present invention.

An oxide film 36 and then a nitride film 37 are deposited over the whole surface of the gate electrode 21 and the entire exposed surface of the semiconductor substrate 31, and then etched back. As a result, as shown in FIG. 3, a dummy sidewall 22 is formed which covers side surfaces of the gate electrode 21 and the gate insulating film 33 and a predetermined area of the major surface of the semiconductor substrate 31 which extends laterally from the side surfaces. For example, the oxide film 36 has a film thickness of 1 to 30 nm and the nitride film 37 has a film thickness of 20 to 100 nm, from which the dummy sidewall 22 is formed.

<Source and Drain (Impurity Region) Formation Process>

Figure 4:
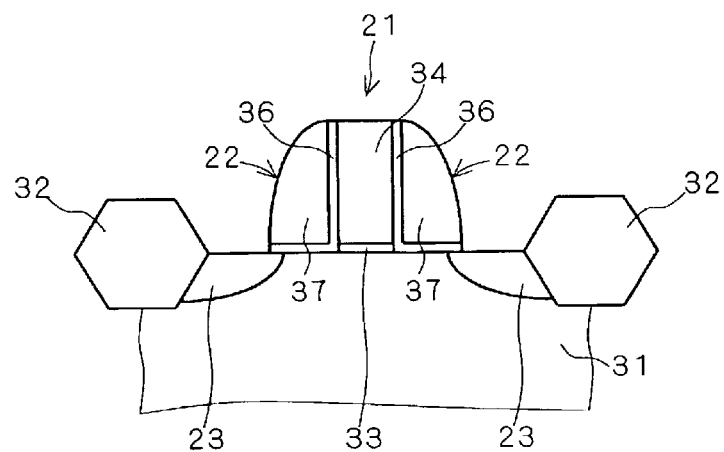
FIG. 4 is a schematic diagram illustrating a source and drain formation process in the semiconductor device manufacturing method according to the first preferred embodiment of the present invention.

By ion implantation, source and drain regions (impurity regions) 23 are formed as shown in FIG. 4. This process is performed individually for NMOS and PMOS structures, for example by covering either one of the structures with a resist.

For example, for formation of an NMOS transistor, arsenic may be implanted with an implant energy of between 10 and 100 keV and a concentration dose of between $1\times10^{15}$ cm$^{-2}$ and $5\times10^{16}$ cm$^{-2}$, while for formation of a PMOS transistor, boron (B) may be implanted with an implant energy of between 1 and 10 keV and a concentration dose of between $1\times10^{15}$ cm$^{-2}$ and $5\times10^{16}$ cm$^{-2}$. Or, for formation of a PMOS transistor, BF$_2$ may be implanted with an implant energy of between 5 and 50 keV and a concentration dose of between $1\times10^{15}$ cm$^{-2}$ and $5\times10^{16}$ cm$^{-2}$.

Following this, implanted impurities are activated by thermal processing (annealing process). In this case, rapid thermal annealing or annealing using a vertical diffusion furnace is performed immediately after impurity implantation. Or, instead of this, heat to be applied at the time of formation of a protective oxide film 38 (cf. FIG. 5) may be used. The thermal processing should be performed, for example at a temperature of between 800 and 1100° C., maintaining the maximum temperature for 0 to 30 sec. Even if the maximum temperature is maintained for 0 sec, thermal processing can be performed during the rise and fall times of temperature.

<Protective Oxidation Process>

Figure 5:
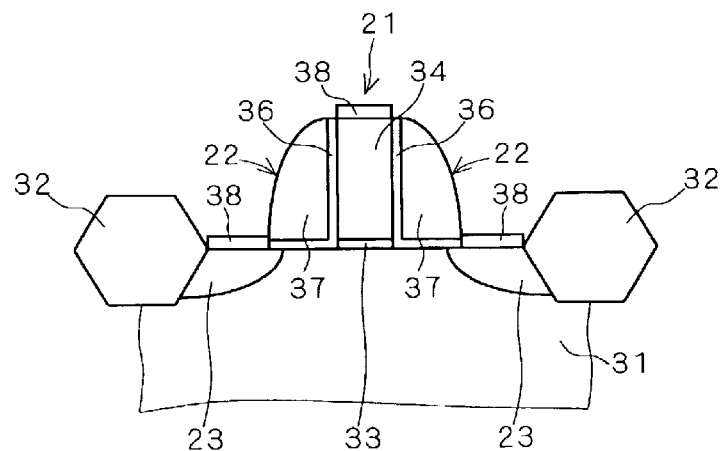
FIG. 5 is a schematic diagram illustrating a protective oxidation process in the semiconductor device manufacturing method according to the first preferred embodiment of the present invention.

By thermal oxidation, the protective oxide film 38 is formed on the upper surface of the gate electrode 21 and on the surfaces of the source and drain regions 23 (FIG. 5). This thermal oxidation process uses the dummy sidewall 22 as a mask. Strictly, the nitride film 37 exposed at the surface of the dummy sidewall 22 is also oxidized slightly, but such oxidation is negligible as compared with that of the upper surface of the gate electrode 21 and the surfaces of the source and drain regions 23. Thus, in this thermal oxidation process, almost no oxide film is formed on the nitride film 37 and the protective oxide film 38 is formed only on the upper surface of the gate electrode 21 and on the surfaces of the source and drain regions 23. Here, thermal oxidation may, for example, be dry oxidation performed under conditions of an oxidation temperature of between 800 and 1000° C. and an oxidation time of between 10 and 60 min, by which the protective oxide film 38 of 1 to 10 nm should be formed. Or, instead of thermal oxidation, ramp oxidation performed under conditions of an oxidation temperature of between 850 and 1100° C. and an oxidation time of between 10 and 60 sec may be adopted.

<Dummy Sidewall Processing Process>

The nitride film 37 of the dummy sidewall 22 is etched using phosphoric acid and completely removed (FIG. 6). Thereby, an L-shaped oxide film 36 as shown in FIG. 6 is left in the region where the dummy sidewall 22 was formed, i.e., on the side surfaces of the gate electrode 21 and the gate insulating film 33 and on a predetermined area of the major surface of the semiconductor substrate 31 which extends laterally from the side surfaces. That is, the side surfaces of the gate electrode 21 and the gate insulating film 33 and part of the major surface of the semiconductor substrate 31 are covered only with the oxide film 36, which means that the thickness of covering is reduced as compared with that in the state of FIG. 5 where the side surfaces of the gate electrode 21 and the gate insulating film 33 and part of the major surface of the semiconductor substrate 31 are covered also with the nitride film 37 of the dummy sidewall 22. This etching process should be performed, for example at a temperature of between 150 and 190° C. for 1 to 20 min.

The oxide film 36 may be removed thereafter. The removal of the oxide film 36 may be performed, for example by etching with buffered hydrofluoric acid having a concentration ratio of 100:1, where for every 1 part of HF, 100 parts of HNaF are used, for 10 to 120 sec (hereinafter referred to as 100:1 HF etching).

Further, gate reoxidation may be performed for protection of the gate insulating film at the gate edge. Reoxidation may, for example, be ramp oxidation performed under conditions of a reoxidation temperature of between 850 and 1100° C. and a reoxidation time of between 10 and 60 sec. Or, ISSG (In-Situ Stream Generation) oxidation performed under conditions of an oxidation temperature of between 850 and 1100° C. and an oxidation time of between 10 and 60 sec may be adopted.

<Source and Drain (Impurity Region) Extension Process>

As shown in FIG. 7, source and drain extension regions 39 are formed by ion implantation to extend under part of the gate insulating film 33. Thereby, the region functioning as source and drain extends from the source and drain regions 23 to the source and drain extension regions 39. This process is performed individually for NMOS and PMOS structures, for example by covering either one of the structures with a resist. At this time, areas not to be ion implanted are masked with a photoresist. For example, for formation of an NMOS transistor, arsenic may be implanted with an acceleration energy of between 0.1 and 10 keV and a concentration dose of between $1 \times 10^{14}$ cm$^{-2}$ and $1 \times 10^{16}$ cm$^{-2}$, while for formation of a PMOS transistor, boron (B) may be implanted with an acceleration energy of between 0.1 and 8 keV and a concentration dose of between $1 \times 10^{14}$ cm$^{-2}$ and $1 \times 10^{16}$ cm$^{-2}$. Or, for formation of a PMOS transistor, BF$_2$ may be implanted with an acceleration energy of between 1 and 30 keV and a concentration dose of between $1 \times 10^{14}$ cm$^{-2}$ and $1 \times 10^{16}$ cm$^{-2}$.

Further, pocket implantation may be performed. In this case, for an NMOS transistor, boron may be ion implanted with an acceleration energy of between 3 and 15 keV and a concentration dose of between $1 \times 10^{13}$ cm$^{-2}$ and $5 \times 10^{13}$ cm$^{-2}$, while for a PMOS transistor, arsenic (As) may be ion implanted with an acceleration energy of between 40 and 140 keV and a concentration dose of between $1 \times 10^{12}$ cm$^{-2}$ and $1 \times 10^{14}$ cm$^{-2}$. Or, phosphorous (P) may be implanted with an implant energy of between 20 and 70 keV and a concentration dose of between $1 \times 10^{12}$ cm$^{-2}$ and $1 \times 10^{13}$ cm$^{-2}$, or such impurity ions may be implanted in mixtures.

<Sidewall Formation Process>

Figure 8:
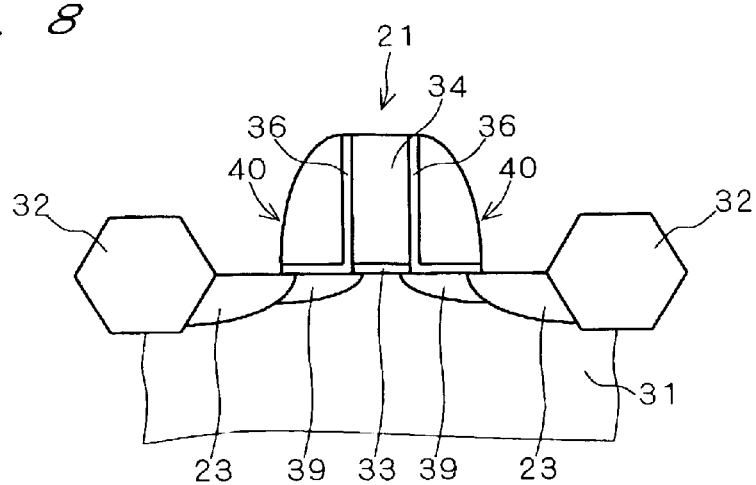
FIG. 8 is a schematic diagram illustrating a sidewall formation process in the semiconductor device manufacturing method according to the first preferred embodiment of the present invention.

As shown in FIG. 8, a nitride film is formed in a direction lateral to the side surface of the oxide film 36 to form a sidewall 40 which is similar in shape to the aforementioned dummy sidewall 22. In this case, the sidewall 40 may be formed, for example by depositing a nitride film over the whole surface and then etching back the film. The film to be deposited may be of oxide film or of a multilayer structure of oxide and nitride films. A typical width (a dimension in a direction parallel to the major surface) of the sidewall 40 ranges from 30 to 100 nm.

<Source and Drain Extension Activation Annealing Process>

Impurities introduced by ion implantation for formation of the source and drain extension regions 39 are activated. This may be performed, for example by RTA (Rapid Thermal Annealing) at a temperature of between 700 and 1075° C. for 0 to 30 seconds of processing time. Or, it may be performed in a vertical diffusion furnace at a temperature of between 400 and 600° C. for 1 to 10 hours of processing time. Or, activation of the source and drain extension regions 39 may be performed by subsequent annealing for silicidation which will later be described.

For the formation of the source and drain extension regions 39, solid phase diffusion may be applied. In that case, the source and drain (impurity region) extension process, the sidewall formation process and the source and drain extension activation annealing process are modified as follows (not shown).

First, a PSG (phospho-silicate glass) film having a phosphorous concentration of 1 to 20% is deposited to a thickness of several tens nm to 100 nm over the whole surface, and then the PSG film in the PMOS region is removed by lithography and wet etching, for example.

Next, a BSG (boron-silicate glass) film containing 1 to 20% of boron is deposited to a thickness of about several tens nm to about 100 nm over the whole surface, and the BSG film deposited on the PSG film in the NMOS region is removed by lithography and wet etching. By arranging the PSG film in the NMOS region and the BSG film in the PMOS region in approximately the same thickness, the processed sidewall 40 can have a uniform width (or dimension in a direction parallel to the major surface). Phosphorous in the PSG film is then diffused in solid phase into the semiconductor substrate 31 of silicon by thermal processing such as RTA, thereby forming shallow n-type extension. Similarly, boron in the BSG film forms shallow p-type extension.

<Silicidation Process>

A metal such as cobalt is deposited to form a silicide layer on the source and drain regions 23.

<Interlayer Film Formation Process>

Thereafter, an interlayer film, interconnections and the like are formed according to an ordinary semiconductor integrated circuit manufacturing method.

As above described, since the protective oxide film 38 is formed on the upper surface of the gate electrode 21 and on the surfaces of the source and drain regions 23, it is possible in the dummy sidewall processing process to efficiently prevent conventional surface roughness of the upper surface of the gate electrode 21 and the source and drain regions 23 due to phosphorous acid. By avoiding surface roughness of the semiconductor substrate 31 and the gate electrode 21 due to phosphoric acid, both reductions in junction leakage current (low power consumption) and improvements in the reliability of the gate insulating film 33 (high reliability) can be achieved without losing original advantages of the replacement sidewall process (e.g. suppression of short channel effect and improvements in drive capability).

Second Preferred Embodiment

FIGS. 9 to 16 are schematic diagrams illustrating a process sequence of a semiconductor device manufacturing method according to a second preferred embodiment of the present invention. In FIGS. 9 to 16, components having functions similar to those of the first preferred embodiment are denoted by the same reference numerals. The semiconductor device manufacturing method according to this preferred embodiment changes the order of executing the source and drain (impurity region) formation process and the protective oxidation process.

<Element Isolation Process>

Figure 9:
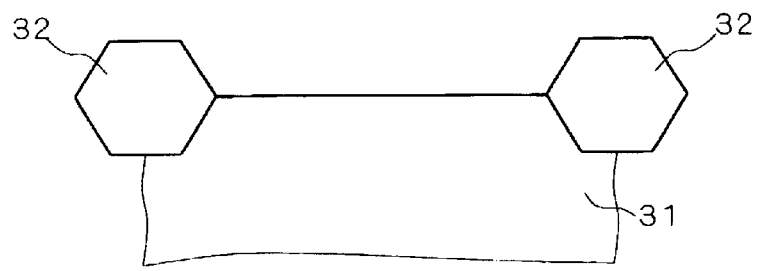
FIG. 9 is a schematic diagram illustrating an element isolation process in a semiconductor device manufacturing method according to a second preferred embodiment of the present invention.

FIG. 9 shows a cross-section after completion of an element isolation process. As in the first preferred embodiment, the isolation oxide film 32 is formed for element isolation on the major surface of the semiconductor substrate 31. The isolation oxide film 32 sections an element region of the semiconductor substrate 31.

<Gate Insulating Film Formation Process>

As in the first preferred embodiment, the gate insulating film 33 (cf. FIG. 10) having a thickness of 0.5 to 9 nm is formed on the major surface of the element region of the semiconductor substrate 31.

<Gate Electrode Deposition Process>

As in the first preferred embodiment, the polysilicon layer 34 (cf. FIG. 10) is formed on the gate insulating film 33.

<Gate Electrode Formation Process>

Figure 10:
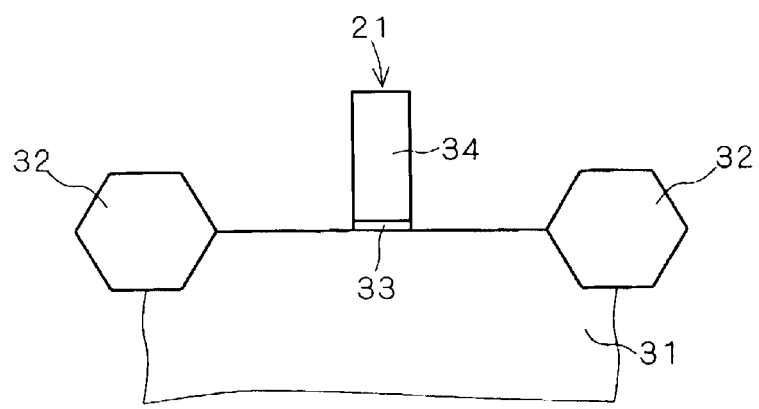
FIG. 10 is a schematic diagram illustrating a gate electrode formation process in the semiconductor device manufacturing method according to the second preferred embodiment of the present invention.

As in the first preferred embodiment, a resist is applied and a mask pattern of the gate electrode 21 is transferred and developed. Polysilicon is then anisotropically etched using a residual resist as a mask, whereby the gate electrode 21 as shown in FIG. 10 is formed.

<Dummy Sidewall Formation Process>

Figure 11:
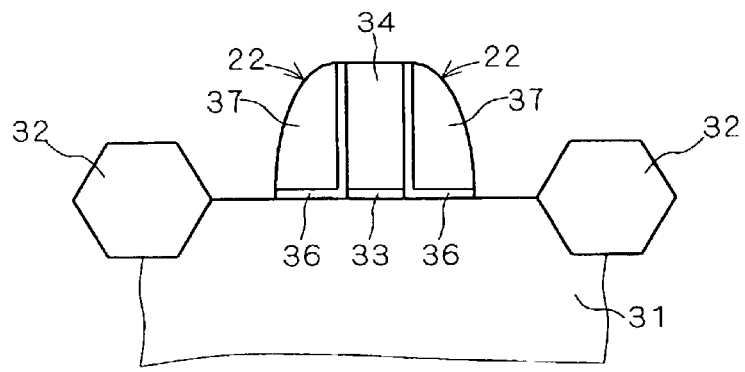
FIG. 11 is a schematic diagram illustrating a dummy sidewall formation process in the semiconductor device manufacturing method according to the second preferred embodiment of the present invention.

As in the first preferred embodiment, the dummy sidewall 22 as shown in FIG. 11 is formed.

<Protective Oxidation Process>

Figure 12:
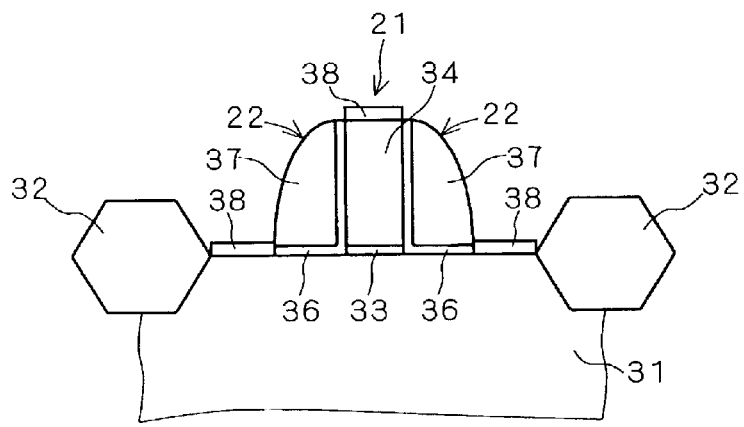
FIG. 12 is a schematic diagram illustrating a protective oxidation process in the semiconductor device manufacturing method according to the second preferred embodiment of the present invention.

By thermal oxidation, as shown in FIG. 12, the protective oxide film 38 is formed on the semiconductor substrate 31 and on the upper surface of the gate electrode 21, where almost no oxide film is formed on the nitride film 37. Here, thermal oxidation may, for example, be dry oxidation performed under conditions of an oxidation temperature of between 800 and 1000° C. and an oxidation time of between 10 and 60 min, by which the protective oxide film 38 of 1 to 10 nm should be formed. Or, instead of thermal oxidation, ramp oxidation performed under conditions of an oxidation temperature of between 850 and 1100° C. and an oxidation time of between 10 and 60 sec may be adopted.

<Source and Drain (Impurity Region) Formation Process>

Figure 13:
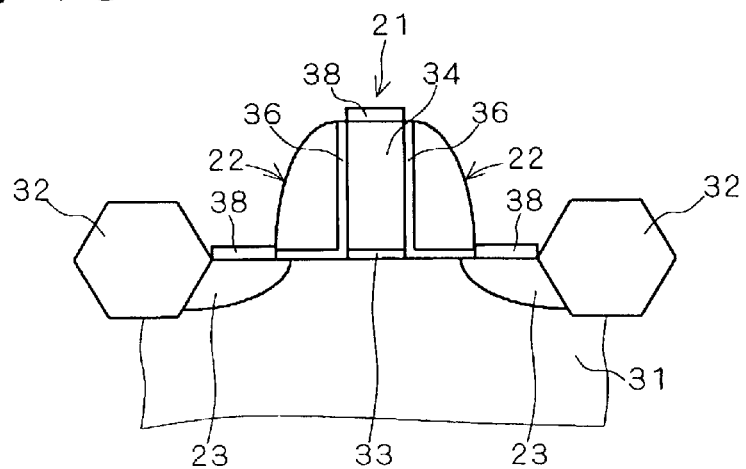
FIG. 13 is a schematic diagram illustrating a source and drain formation process in the semiconductor device manufacturing method according to the second preferred embodiment of the present invention.

By ion implantation, the source and drain regions (impurity regions) 23 are formed as shown in FIG. 13. This process is performed individually for NMOS and PMOS structures, for example by covering either one of the structures with a resist.

For example, for formation of an NMOS transistor, arsenic may be implanted with an implant energy of between 10 and 100 keV and a concentration dose of between $1\times10^{15}$ cm$^{-2}$ and $5\times10^{16}$ cm$^{-2}$, while for formation of a PMOS transistor, boron (B) may be implanted with an implant energy of between 1 and 10 keV and a concentration dose of between $1\times10^{15}$ cm$^{-2}$ and $5\times10^{16}$ cm$^{-2}$. Or, for formation of a PMOS transistor, BF$_2$ may be implanted with an implant energy of between 5 and 50 keV and a concentration dose of between $1\times10^{15}$ cm$^{-2}$ and $5\times10^{16}$ cm$^{-2}$.

Following this, implanted impurities are activated by thermal processing. In this case, rapid thermal annealing or annealing using a vertical diffusion furnace is performed immediately after impurity implantation. The thermal processing should be carried out, for example at a temperature of between 800 and 1100° C., maintaining the maximum temperature for 0 to 30 sec. Even if the maximum temperature is kept for 0 sec, thermal processing can be performed during the rise and fall times of temperature.

<Dummy Sidewall Processing Process>

Figure 14:
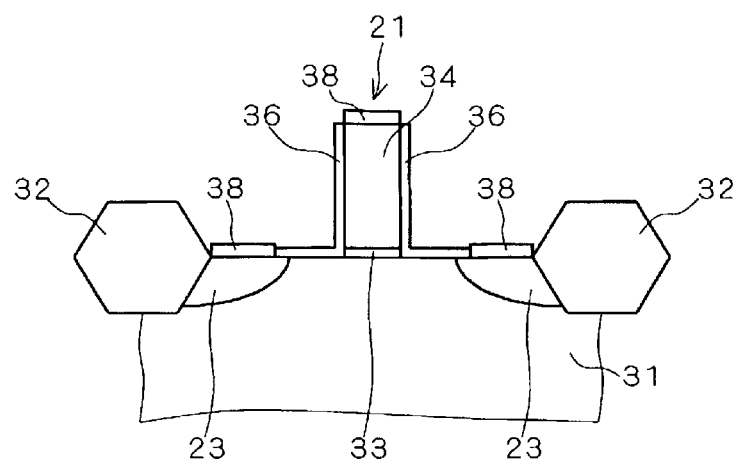
FIG. 14 is a schematic diagram illustrating a dummy sidewall processing process in the semiconductor device manufacturing method according to the second preferred embodiment of the present invention.

As in the first preferred embodiment, the nitride film 37 of the dummy sidewall 22 is etched using phosphoric acid and completely removed as shown in FIG. 14. Thereby, the L-shaped oxide film 36 as shown in FIG. 14 is left in the region where the dummy sidewall 22 was formed, i.e., on the side surfaces of the gate electrode 21 and the gate insulating film 33 and on a predetermined area of the major surface of the semiconductor substrate 31 which extends laterally from the side surfaces. That is, the side surfaces of the gate electrode 21 and the gate insulating film 33 and part of the major surface of the semiconductor substrate 31 are covered only with the oxide film 36, which means that the thickness of covering is reduced as compared with that in the state of FIG. 13 where the side surfaces of the gate electrode 21 and the gate insulating film 33 and part of the major surface of the semiconductor substrate 31 are covered also with the nitride film 37 of the dummy sidewall 22.

<Source and Drain (Impurity Region) Extension Process>

Figure 15:
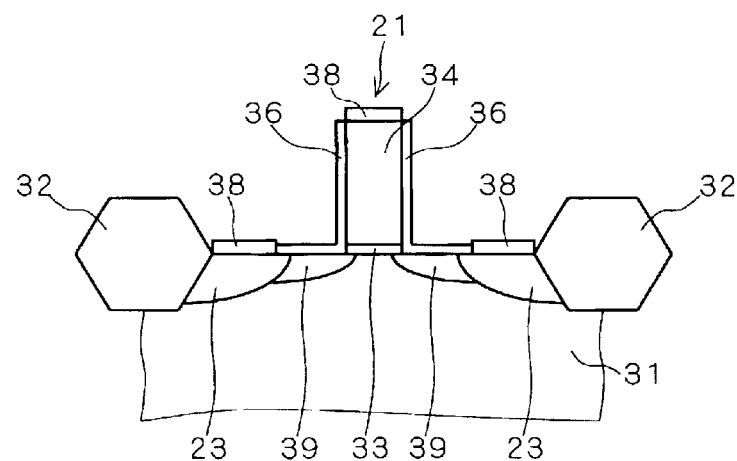
FIG. 15 is a schematic diagram illustrating a source and drain extension process in the semiconductor device manufacturing method according to the second preferred embodiment of the present invention.

As in the first preferred embodiment and as shown in FIG. 15, the source and drain extension regions 39 are formed by ion implantation to extend under part of the gate insulating film 33.

<Sidewall Formation Process>

Figure 16:
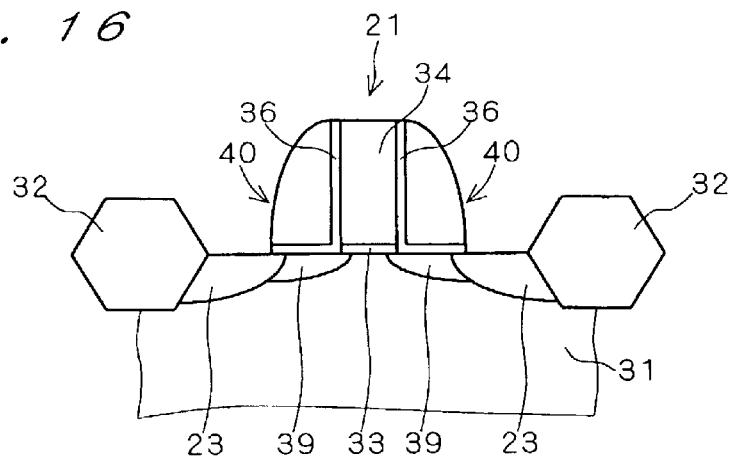
FIG. 16 is a schematic diagram illustrating a sidewall formation process in the semiconductor device manufacturing method according to the second preferred embodiment of the present invention.

As in the first preferred embodiment, a nitride film is formed in a direction lateral to the side surface of the oxide film 36 to form the sidewall 40 similar to the aforementioned dummy sidewall 22 (FIG. 16).

<Source and Drain Extension Activation Annealing Process>

As in the first preferred embodiment, impurities introduced by ion implantation for formation of the source and drain extension regions 39 are activated.

<Silicidation Process>

As in the first preferred embodiment, a metal such as cobalt is deposited to form a silicide layer on the source and drain regions 23.

<Interlayer Film Formation Process>

Thereafter, as in the first preferred embodiment, an interlayer film, interconnections and the like are formed according to an ordinary semiconductor integrated circuit manufacturing method.

As above described, since the protective oxide film 38 is formed on the upper surface of the gate electrode 21 and on the surfaces of the source and drain regions 23, it is possible in the dummy sidewall processing process to efficiently prevent conventional surface roughness of the upper surface of the gate electrode 21 and the source and drain regions 23 due to phosphorous acid. By avoiding surface roughness of the semiconductor substrate 31 and the gate electrode 21 due to phosphoric acid, both reductions in junction leakage current (low power consumption) and improvements in the reliability of the gate insulating film 33 (high reliability) can be achieved without losing original advantages of the replacement sidewall process (e.g. suppression of short channel effect and improvements in drive capability). Further, as compared with the first preferred embodiment, since heat of protective oxidation is not applied to impurities introduced by source and drain implantation and also impurities in the source and drain regions 23 and the gate electrode 21 are activated in a later step, compatibility between suppression of impurity diffusion and an increase in the rate of activation can be increased with ease. By in this way, preventing excess impurity diffusion in, for example, the source and drain regions 23, it is possible to prevent a reduction in threshold voltage and an increase in variation of threshold voltage due to a deterioration in short channel characteristics and excess impurity diffusion in the gate electrode 21 (caused by surface roughness of the gate insulating film 33 due to gate impurities).

Third Preferred Embodiment

FIGS. 17 to 25 are schematic diagrams illustrating a process sequence of a semiconductor device manufacturing method according to a third preferred embodiment of the present invention. In FIGS. 17 to 25, components having functions similar to those of the first and second preferred embodiments are denoted by the same reference numerals. The semiconductor device manufacturing method according to this preferred embodiment differs from the first preferred embodiment in that impurity implantation for acceleration of oxidation is performed prior to protective oxidation. The details of the manufacturing method will be described hereinbelow.

<Element Isolation Process>

Figure 17:
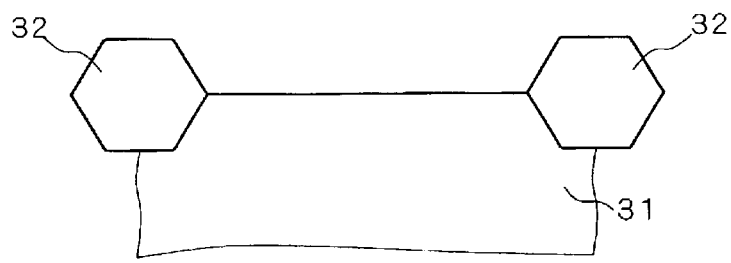
FIG. 17 is a schematic diagram illustrating an element isolation process in a semiconductor device manufacturing method according to a third preferred embodiment of the present invention.

FIG. 17 shows a cross-section after completion of an element isolation process. As in the first preferred embodiment, the isolation oxide film 32 is formed for element isolation on the major surface of the semiconductor substrate 31.

<Gate Insulating Film Formation Process>

As in the first preferred embodiment, the gate insulating film 33 (cf. FIG. 18) having a thickness of 0.5 to 9 nm is formed on the major surface of the element region of the semiconductor substrate 31.

<Gate Electrode Deposition Process>

As in the first preferred embodiment, the polysilicon layer 34 (cf. FIG. 18) is formed on the gate insulating film 33.

<Gate Electrode Formation Process>

Figure 18:
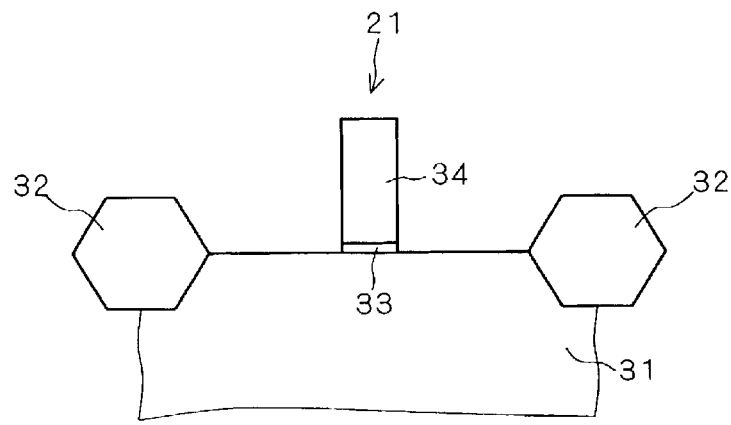
FIG. 18 is a schematic diagram illustrating a gate electrode formation process in the semiconductor device manufacturing method according to the third preferred embodiment of the present invention.

As in the first preferred embodiment, a resist is applied and a mask pattern of the gate electrode 21 is transferred and developed. Polysilicon is then anisotropically etched using a residual resist as a mask, whereby the gate electrode 21 as shown in FIG. 18 is formed.

<Dummy Sidewall Formation Process>

Figure 19:
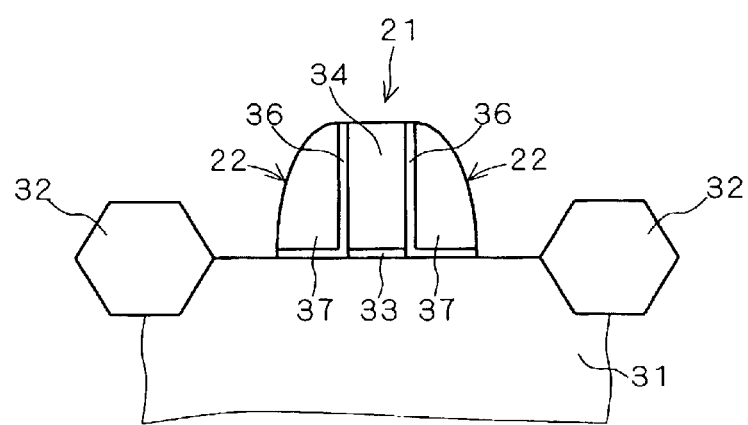
FIG. 19 is a schematic diagram illustrating a dummy sidewall formation process in the semiconductor device manufacturing method according to the third preferred embodiment of the present invention.

As in the first preferred embodiment, the dummy sidewall 22 as shown in FIG. 19 is formed.

<Source and Drain (Impurity Region) Formation Process>

Figure 20:
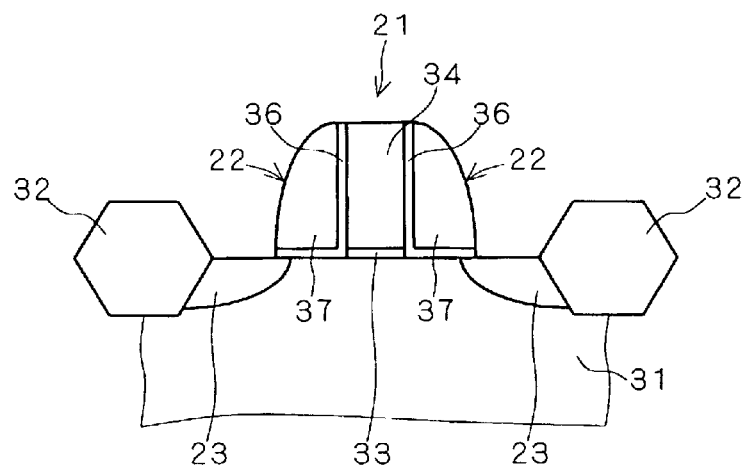
FIG. 20 is a schematic diagram illustrating a source and drain formation process in the semiconductor device manufacturing method according to the third preferred embodiment of the present invention.

By ion implantation, the source and drain regions (impurity regions) 23 are formed as shown in FIG. 20. This process is performed individually for NMOS and PMOS structures, for example by covering either one of the structures with a resist.

For example, for formation of an NMOS transistor, arsenic may be implanted with an implant energy of between 10 and 100 keV and a concentration dose of between $1 \times 10^{15}$ cm$^{-2}$ and $5 \times 10^{16}$ cm$^{-2}$, while for formation of a PMOS transistor, boron (B) may be implanted with an implant energy of between 1 and 10 keV and a concentration dose of between $1 \times 10^{15}$ cm$^{-2}$ and $5 \times 10^{16}$ cm$^{-2}$. Or, for formation of a PMOS transistor, $BF_2$ may be implanted with an implant energy of between 5 and 50 keV and a concentration dose of between $1 \times 10^{15}$ cm$^{-2}$ and $5 \times 10^{16}$ cm$^{-2}$.

Following this, implanted impurities are activated by thermal processing (annealing process). In this case, rapid thermal annealing or annealing using a vertical diffusion furnace is performed immediately after impurity implantation. Or, instead of this, heat to be applied at the time of formation of the protective oxide film 38 (cf. FIG. 22) may be used. The thermal processing should be performed, for example at a temperature of between 800 and 1100° C., maintaining the maximum temperature for 0 to 30 sec. Even if the maximum temperature is kept for 0 sec, thermal processing can be performed during the rise and fall times of temperature.

<Oxidation Acceleration Process>

Figure 21:
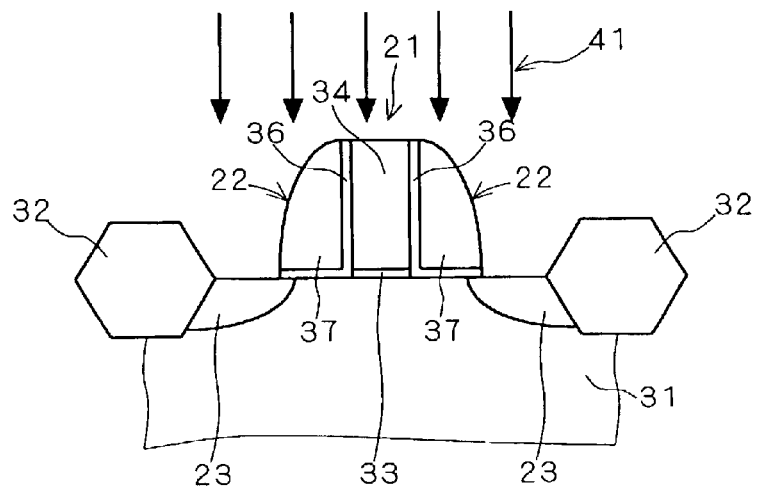
FIG. 21 is a schematic diagram illustrating an oxidation acceleration process in the semiconductor device manufacturing method according to the third preferred embodiment of the present invention.

As a preparation for acceleration of the formation of the protective oxide film 38 (cf. FIG. 22), impurities 41 are ion implanted as shown in FIG. 21. For example, fluorine or oxygen may be implanted with an acceleration energy of between 0.1 and 30 keV and a concentration dose of between $1 \times 10^{14}$ cm$^{-2}$ and $1 \times 10^{16}$ cm$^{-2}$.

<Protective Oxidation Process>

Figure 22:
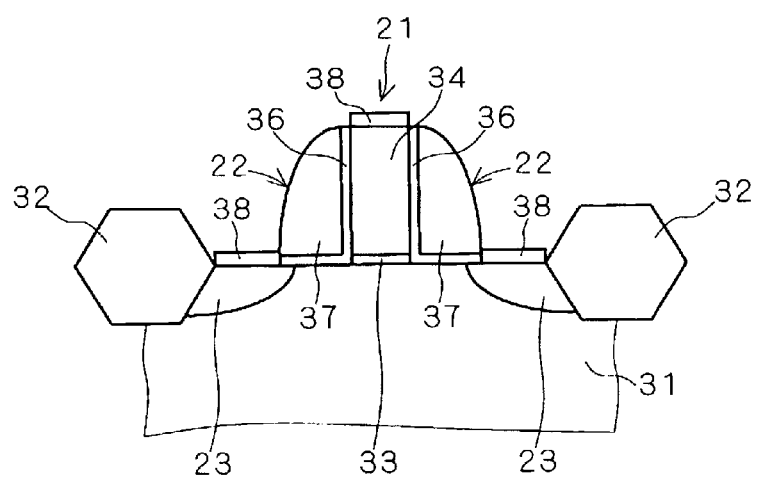
FIG. 22 is a schematic diagram illustrating a protective oxidation process in the semiconductor device manufacturing method according to the third preferred embodiment of the present invention.

By thermal oxidation, as shown in FIG. 22, the protective oxide film 38 is formed on the upper surface of the gate electrode 21 and on the surfaces of the source and drain regions 23, where almost no oxide film is formed on the nitride film 37. Here, thermal oxidation may, for example, be dry oxidation performed under conditions of an oxidation temperature of between 800 and 1000° C. and an oxidation time of between 10 and 60 min, by which the protective oxide film 38 of 1 to 10 nm should be formed. Or, instead of thermal oxidation, ramp oxidation performed under conditions of an oxidation temperature of between 850 and 1100° C. and an oxidation time of between 10 and 60 sec may be adopted.

<Dummy Sidewall Processing Process>

Figure 23:
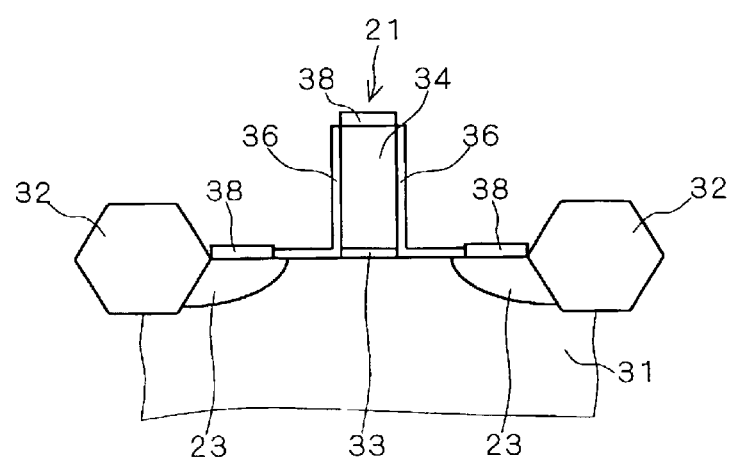
FIG. 23 is a schematic diagram illustrating a dummy sidewall processing process in the semiconductor device manufacturing method according to the third preferred embodiment of the present invention.

As in the first preferred embodiment, the nitride film 37 of the dummy sidewall 22 is etched using phosphoric acid and completely removed as shown in FIG. 23. Thereby, the L-shaped oxide film 36 as shown in FIG. 23 is left in the region where the dummy sidewall 22 was formed, i.e., on the side surfaces of the gate electrode 21 and the gate insulating film 33 and on a predetermined area of the major surface of the semiconductor substrate 31 which extends laterally from the side surfaces. That is, the side surfaces of the gate electrode 21 and the gate insulating film 33 and part of the major surface of the semiconductor substrate 31 are covered only with the oxide film 36, which means that the thickness of covering is reduced as compared with that in the state of FIG. 22 where the side surfaces of the gate electrode 21 and the gate insulating film 33 and part of the major surface of the semiconductor substrate 31 are covered also with the nitride film 37 of the dummy sidewall 22.

<Source and Drain (Impurity Region) Extension Process>

Figure 24:
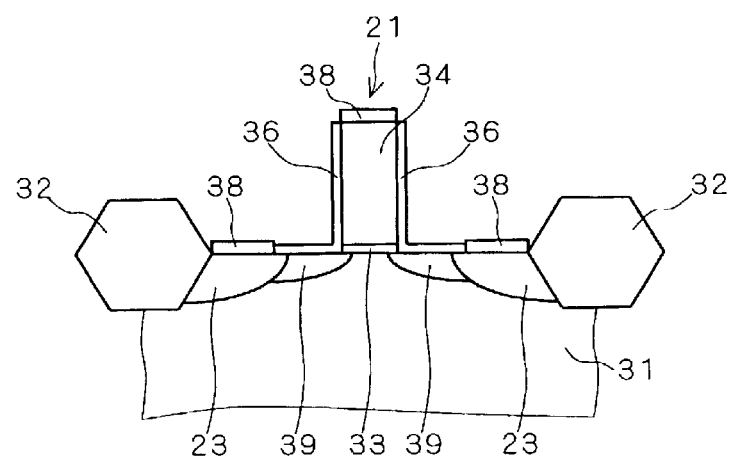
FIG. 24 is a schematic diagram illustrating a source and drain extension process in the semiconductor device manufacturing method according to the third preferred embodiment of the present invention.

As in the first preferred embodiment and as shown in FIG. 24, the source and drain extension regions 39 are formed by ion implantation to extend under part of the gate insulating film 33.

<Sidewall Formation Process>

Figure 25:
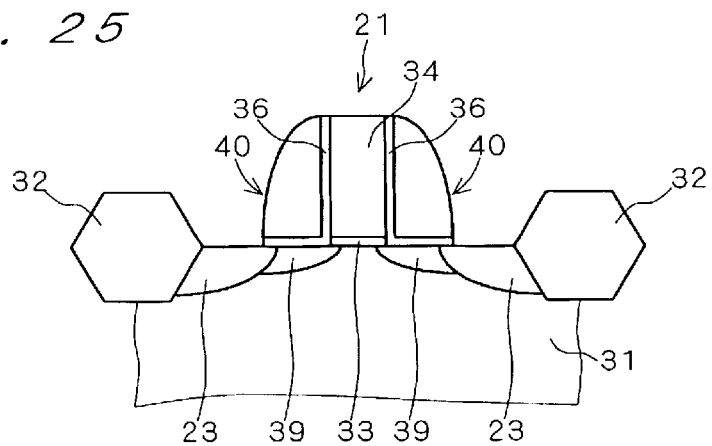
FIG. 25 is a schematic diagram illustrating a sidewall formation process in the semiconductor device manufacturing method according to the third preferred embodiment of the present invention.

As in the first preferred embodiment and as shown in FIG. 25, a nitride film is formed in a direction lateral to the side surface of the oxide film 36 to form the sidewall 40 similar to the aforementioned dummy sidewall 22.

<Source and Drain Extension Activation Annealing Process>

As in the first preferred embodiment, impurities introduced by ion implantation for formation of the source and drain extension regions 39 are activated.

<Silicidation Process>

As in the first preferred embodiment, a metal such as cobalt is deposited to form a silicide layer on the source and drain regions 23.

<Interlayer Film Formation Process>

Thereafter, as in the first preferred embodiment, an interlayer film, interconnections, and the like are formed according to an ordinary semiconductor integrated circuit manufacturing method.

As above described, since the protective oxide film 38 is formed on the upper surface of the gate electrode 21 and on the surfaces of the source and drain regions 23, it is possible in the dummy sidewall processing process to efficiently prevent conventional surface roughness of the upper surface of the gate electrode 21 and the source and drain regions 23 due to phosphorous acid. By avoiding surface roughness of the semiconductor substrate 31 and the gate electrode 21 due to phosphoric acid, both reductions in junction leakage current (low power consumption) and improvements in the reliability of the gate insulating film 33 (high reliability) can be achieved without losing original advantages of the replacement sidewall process (e.g. suppression of short channel effect and improvements in drive capability).

Further, the protective oxide film 38 of the same thickness can be formed in shorter time than in the first preferred embodiment, which results in suppression of excess impurity diffusion in the source and drain regions 23 and in the gate electrode 21. By in this way, preventing excess impurity diffusion in, for example, the source and drain regions 23, it is possible to prevent a reduction in threshold voltage and an increase in variation of threshold voltage due to a deterioration in short channel characteristics and excess impurity diffusion in the gate electrode 21 (caused by surface roughness of the gate insulating film 33 due to gate impurities). Besides, channel impurity diffusion can also be suppressed, which makes it easy to achieve an advanced channel structure.

Fourth Preferred Embodiment

FIGS. 26 to 34 are schematic diagrams illustrating a process sequence of a semiconductor device manufacturing method according to a third preferred embodiment of the present invention. In FIGS. 26 to 34, components having functions similar to those of the first through third preferred embodiments are denoted by the same reference numerals. The semiconductor device manufacturing method according to this preferred embodiment differs from the first through third preferred embodiments in that the source and drain are raised. The details of the manufacturing method will be described hereinbelow.

<Element Isolation Process>

Figure 26:
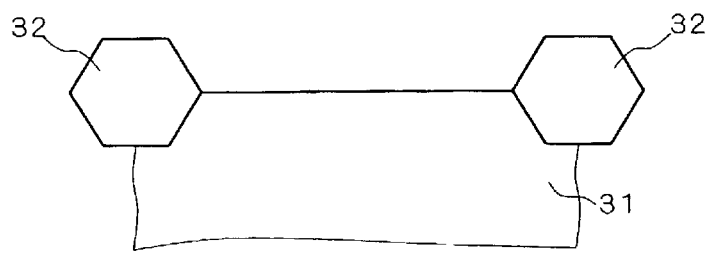
FIG. 26 is a schematic diagram illustrating an element isolation process in a semiconductor device manufacturing method according to a fourth preferred embodiment of the present invention.

FIG. 26 shows a cross-section after completion of an element isolation process. As in the first preferred embodiment, the isolation oxide film 32 is formed for element isolation on the major surface of the semiconductor substrate 31.

<Gate Insulating Film Formation Process>

As in the first preferred embodiment, the gate insulating film 33 (cf. FIG. 27) having a thickness of 0.5 to 9 nm is formed on the major surface of the element region of the semiconductor substrate 31.

<Gate Electrode Deposition Process>

As in the first preferred embodiment, the polysilicon layer 34 (cf. FIG. 27) is formed on the gate insulating film 33.

<Gate Electrode Formation Process>

Figure 27:
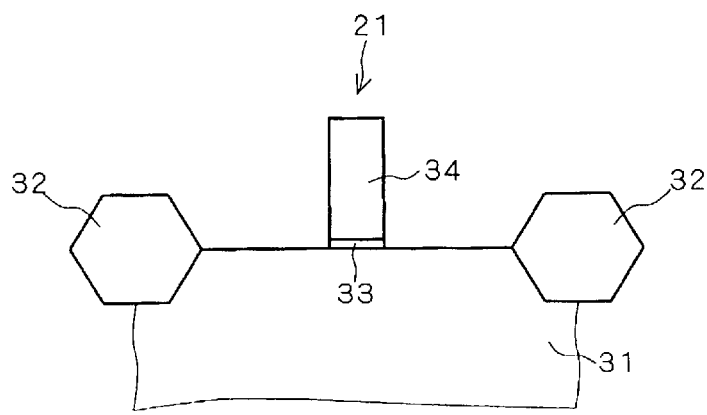
FIG. 27 is a schematic diagram illustrating a gate electrode formation process in the semiconductor device manufacturing method according to the fourth preferred embodiment of the present invention.

As in the first preferred embodiment, a resist is applied and a mask pattern of the gate electrode 21 is transferred and developed. Polysilicon is then anisotropically etched using a residual resist as a mask, whereby the gate electrode 21 as shown in FIG. 27 is formed.

<Dummy Sidewall Formation Process>

Figure 28:
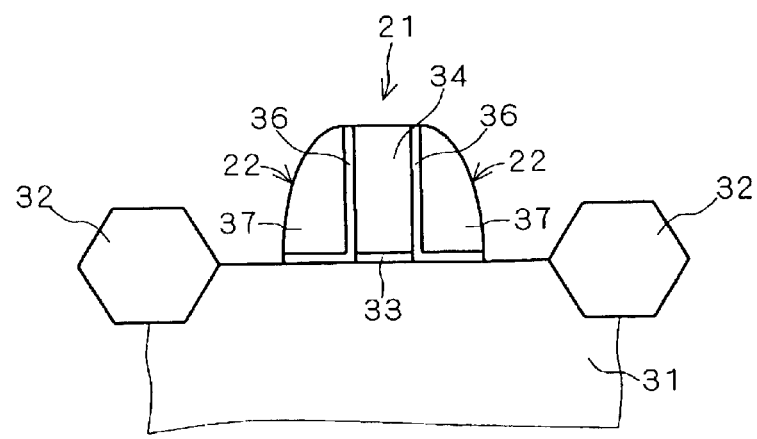
FIG. 28 is a schematic diagram illustrating a dummy sidewall formation process in the semiconductor device manufacturing method according to the fourth preferred embodiment of the present invention.

As in the first preferred embodiment, the dummy sidewall 22 as shown in FIG. 28 is formed.

<Source and Drain (Impurity Region) Formation Process>

Figure 29:
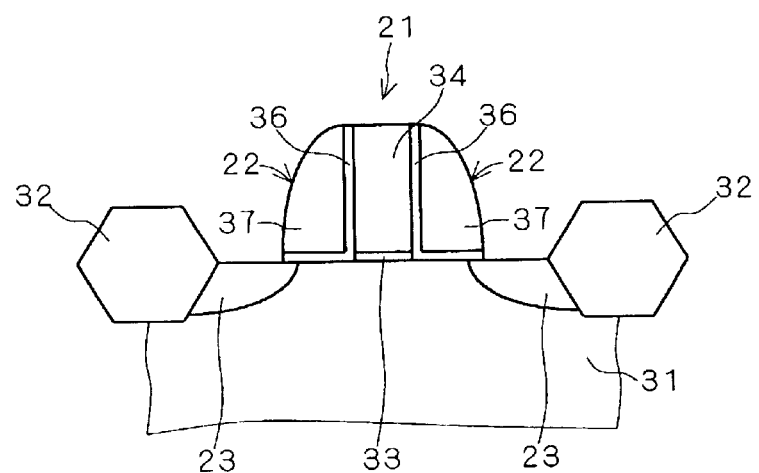
FIG. 29 is a schematic diagram illustrating a source and drain formation process in the semiconductor device manufacturing method according to the fourth preferred embodiment of the present invention.

By ion implantation, the source and drain regions (impurity regions) 23 are formed as shown in FIG. 29. This process is performed individually for NMOS and PMOS structures, for example by covering either one of the structures with a resist.

For example, for formation of an NMOS transistor, arsenic may be implanted with an implant energy of between 10 and 100 keV and a concentration dose of between $1\times10^{15}$ cm$^{-2}$ and $5\times10^{16}$ cm$^{-2}$, while for formation of a PMOS transistor, boron (B) may be implanted with an implant energy of between 1 and 10 keV and a concentration dose of between $1\times10^{15}$ cm$^{-2}$ and $5\times10^{16}$ cm$^{-2}$. Or, for formation of a PMOS transistor, BF$_2$ may be implanted with an implant energy of between 5 and 50 keV and a concentration dose of between $1\times10^{15}$ cm$^{-2}$ and $5\times10^{16}$ cm$^{-2}$. Following this, implanted impurities are activated by thermal processing (annealing process). In this case, rapid thermal annealing or annealing using a vertical diffusion furnace is performed immediately after impurity implantation. Or, instead of this, heat to be applied at the time of formation of the protective oxide film 38 (to be described later) may be used. The thermal processing should be performed, for example at a temperature of between 800 and 1100° C., maintaining the maximum temperature for 0 to 30 sec. Even if the maximum temperature is kept for 0 sec, thermal processing can be performed during the rise and fall times of temperature.

<Source and Drain Raising Process>

Figure 30:
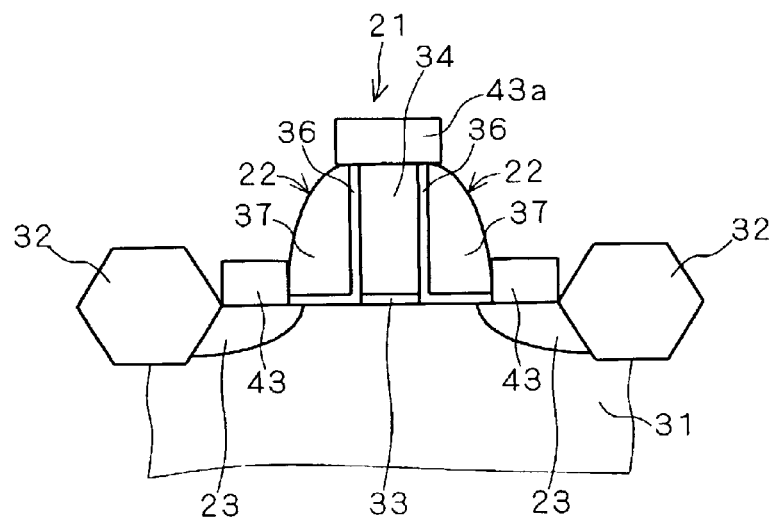
FIG. 30 is a schematic diagram illustrating a source and drain raising process in the semiconductor device manufacturing method according to the fourth preferred embodiment of the present invention.

As shown in FIG. 30, a silicon film 43 is deposited (silicon deposition) using "selective epitaxial growth techniques" for selective silicon deposition on the source and drain regions 23, whereby the source and drain regions 23 are raised. At this time, silicon deposition is not performed on the insulating films such as the isolation oxide film 32 and the dummy sidewall 22. The selective epitaxial growth is performed, for example by CVD using a silane gas as the source gas at a growth temperature of between 500 and 800° C. The source gas may be a desilane gas or a mixture of chroline and hydrogen gases. The film thickness obtained by the growth ranges from 5 to 50 nm. When the polysilicon film is exposed at the upper surface of the gate electrode 21, a silicon film 43a may selectively be grown on the upper surface of the gate electrode 21.

Further, an impurity implantation process may be added. For example, for formation of an NMOS transistor, arsenic may be implanted with an implant energy of between 1 and 80 keV and a concentration dose of between $1\times10^{15}$ cm$^{-2}$ and $5\times10^{16}$ cm$^{-2}$, while for formation of a PMOS transistor, boron (B) may be implanted with an implant energy of between 1 and 8 keV and a concentration dose of between $1\times10$ . cm$^{-2}$ and $5\times10^{16}$ cm$^{-2}$. Or, for formation of a PMOS transistor, BF$_2$ may be implanted with an implant energy of between 5 and 50 keV and a concentration dose of between $1\times10^{15}$ cm$^{-2}$ and $5\times10^{16}$ cm$^{-2}$.

<Protective Oxidation Process>

Figure 31:
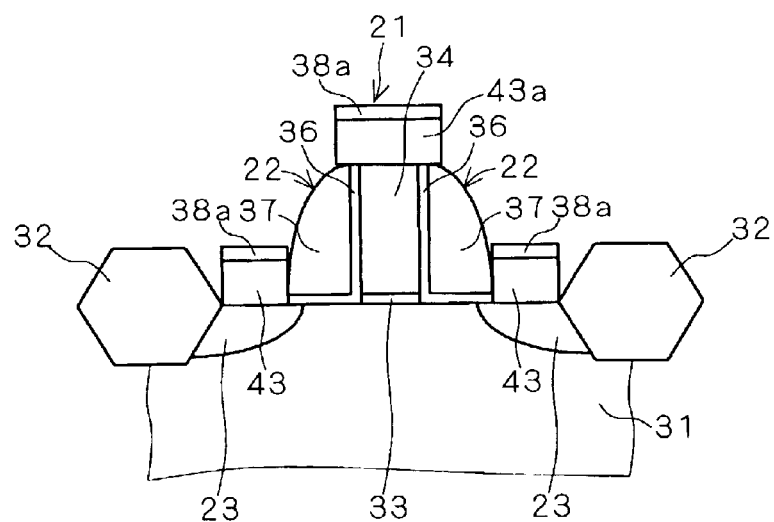
FIG. 31 is a schematic diagram illustrating a protective oxidation process in the semiconductor device manufacturing method according to the fourth preferred embodiment of the present invention.

By thermal oxidation, as shown in FIG. 31, a protective oxide film 38a is formed on the upper surface of the gate electrode 21 and on the surfaces of the source and drain regions 23, where almost no oxide film is formed on the nitride film 37. Here, thermal oxidation may, for example, be dry oxidation performed under conditions of an oxidation temperature of between 800 and 1000° C. and an oxidation time of between 10 and 60 min, by which the protective oxide film 38a of 1 to 10 nm should be formed. Or, instead of thermal oxidation, ramp oxidation performed under conditions of an oxidation temperature of between 850 and 1100° C. and an oxidation time of between 10 and 60 sec may be adopted.

<Dummy Sidewall Processing Process>

Figure 32:
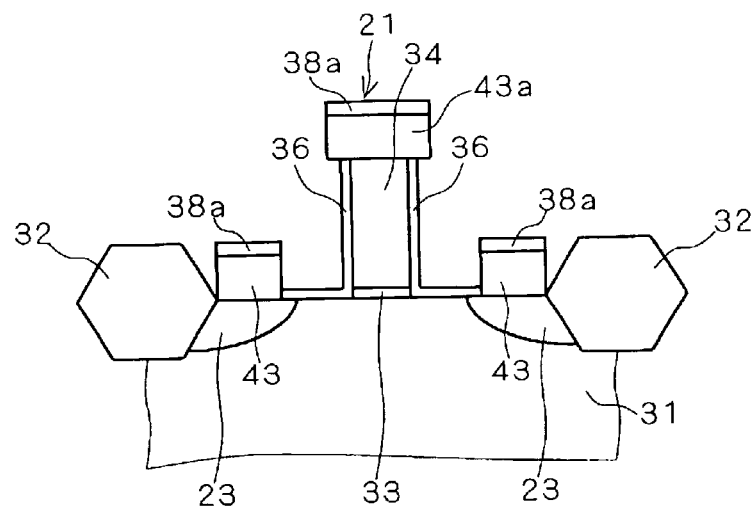
FIG. 32 is a schematic diagram illustrating a dummy sidewall processing process in the semiconductor device manufacturing method according to the fourth preferred embodiment of the present invention.

As in the first preferred embodiment, the nitride film 37 of the dummy sidewall 22 is etched using phosphoric acid and completely removed as shown in FIG. 32. Thereby, the L-shaped oxide film 36 as shown in FIG. 32 is left in the region where the dummy sidewall 22 was formed, i.e., on the side surfaces of the gate electrode 21 and the gate insulating film 33 and on a predetermined area of the major surface of the semiconductor substrate 31 which extends laterally from the side surfaces. That is, the side surfaces of the gate electrode 21 and the gate insulating film 33 and part of the major surface of the semiconductor substrate 31 are covered only with the oxide film 36, which means that the thickness of covering is reduced as compared with that in the state of FIG. 31 where the side surfaces of the gate electrode 21 and the gate insulating film 33 and part of the major surface of the semiconductor substrate 31 are covered also with the nitride film 37 of the dummy sidewall 22.

<Source and Drain (Impurity Region) Extension Process>

Figure 33:
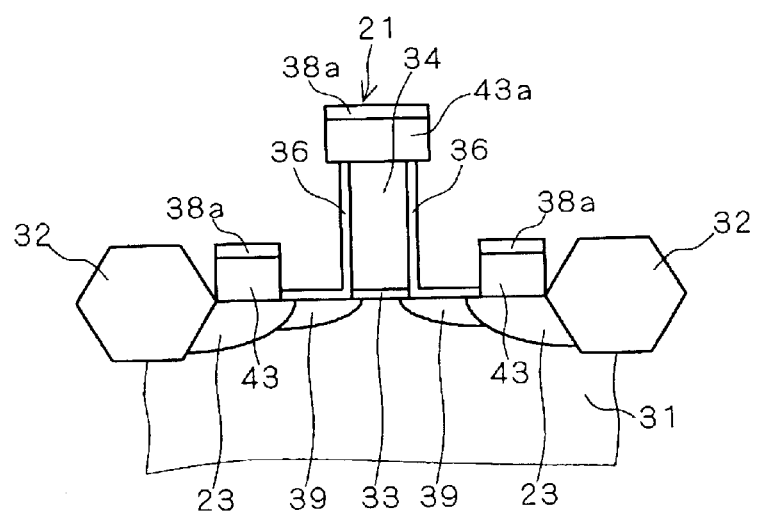
FIG. 33 is a schematic diagram illustrating a source and drain extension process in the semiconductor device manufacturing method according to the fourth preferred embodiment of the present invention.

As in the first preferred embodiment and as shown in FIG. 33, the source and drain extension regions 39 are formed by ion implantation to extend under part of the gate insulating film 33.

<Sidewall Formation Process>

Figure 34:
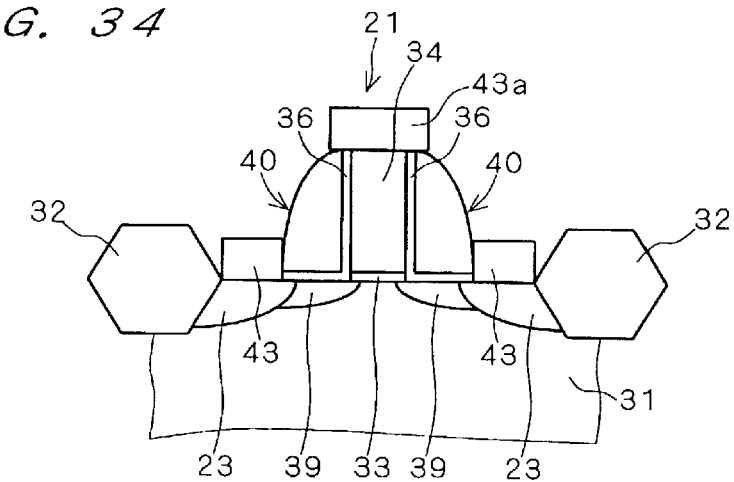
FIG. 34 is a schematic diagram illustrating a sidewall formation process in the semiconductor device manufacturing method according to the fourth preferred embodiment of the present invention.
Figure 35:
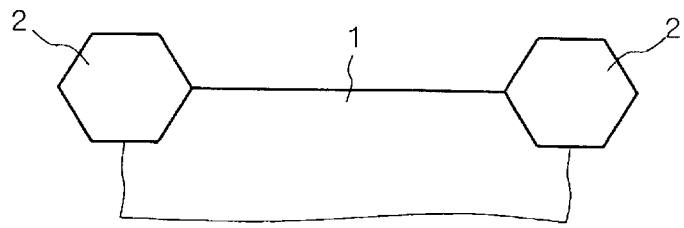
FIG. 35 is a schematic diagram illustrating an element isolation process in a conventional semiconductor device manufacturing method.
Figure 36:
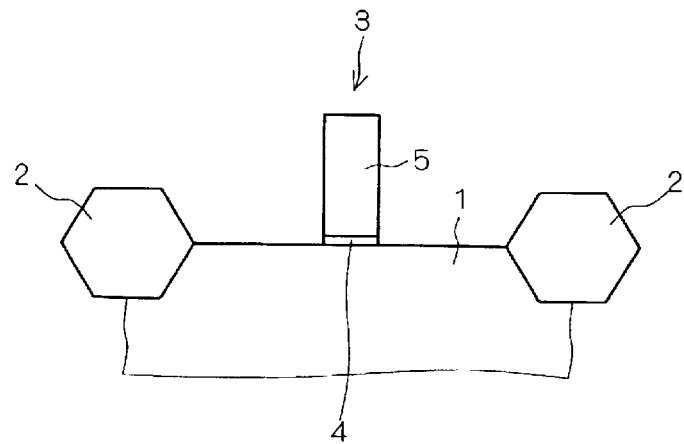
FIG. 36 is a schematic diagram illustrating a gate electrode formation process in the conventional semiconductor device manufacturing method.
Figure 37:
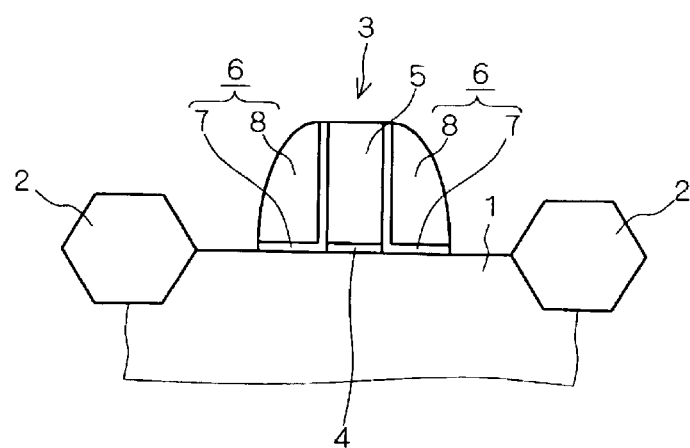
FIG. 37 is a schematic diagram illustrating a dummy sidewall formation process in the conventional semiconductor device manufacturing method.
Figure 38:
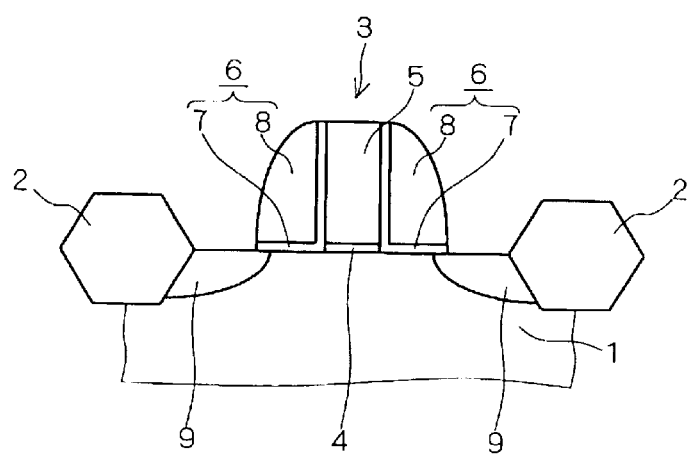
FIG. 38 is a schematic diagram illustrating a source and drain formation process in the conventional semiconductor device manufacturing method.
Figure 39:
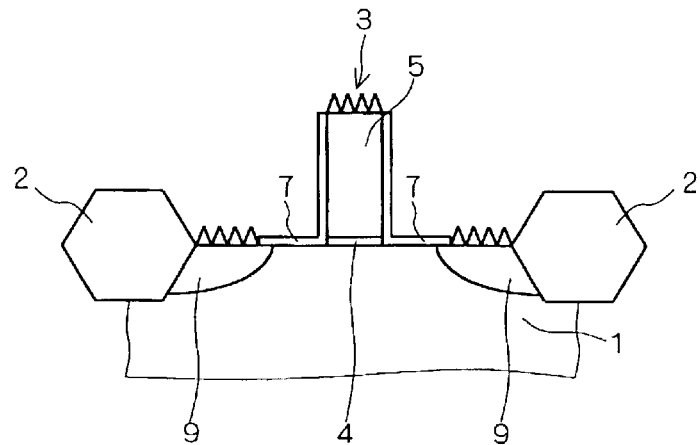
FIG. 39 is a schematic diagram illustrating a dummy sidewall processing process in the conventional semiconductor device manufacturing method.
Figure 40:
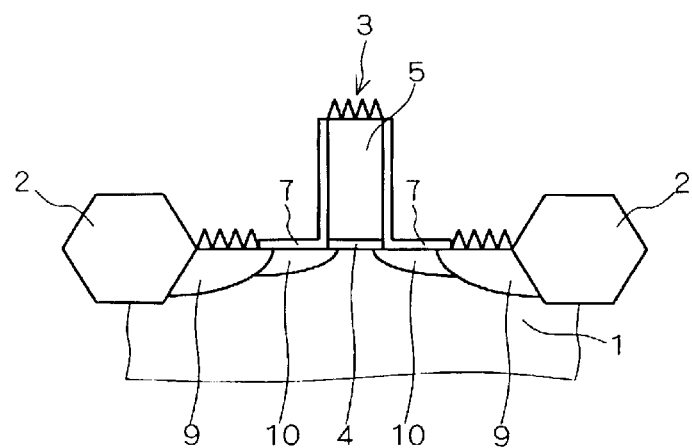
FIG. 40 is a schematic diagram illustrating a source and drain extension process in the conventional semiconductor device manufacturing method.
Figure 41:
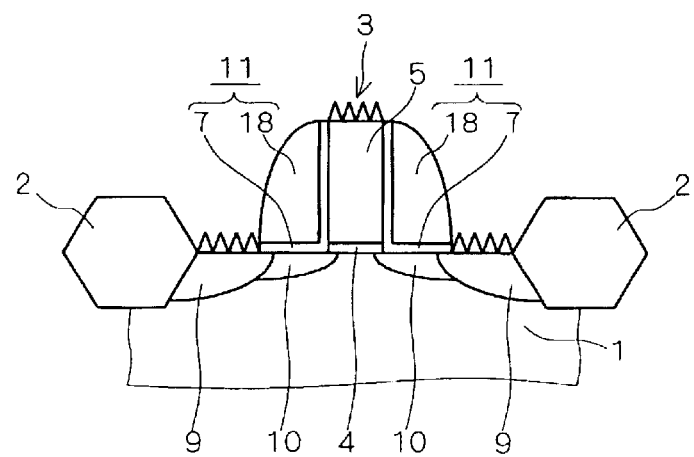
FIG. 41 is a schematic diagram illustrating a sidewall formation process in the conventional semiconductor device manufacturing method.

As in the first preferred embodiment and as shown in FIG. 34, a nitride film is formed in a direction lateral to the side surface of the oxide film 36 to form the sidewall 40 similar to the aforementioned dummy sidewall 22.

<Source and Drain Extension Activation Annealing Process>

As in the first preferred embodiment, impurities introduced by ion implantation for formation of the source and drain extension regions 39 are activated.

<Silicidation Process>

As in the first preferred embodiment, a metal such as cobalt is deposited to form a silicide layer on the source and drain regions 23.

<Interlayer Film Formation Process>

Thereafter, as in the first preferred embodiment, an interlayer film, interconnections and the like are formed according to an ordinary semiconductor integrated circuit manufacturing method.

As above described, since the protective oxide film 38a is formed on the upper surface of the gate electrode 21 and on the surfaces of the source and drain regions 23, it is possible in the dummy sidewall processing process to efficiently prevent conventional surface roughness of the upper surface of the gate electrode 21 and the source and drain regions 23 due to phosphorous acid. By avoiding surface roughness of the semiconductor substrate 31 and the gate electrode 21 due to phosphoric acid, both reductions in junction leakage current (low power consumption) and improvements in the reliability of the gate insulating film 33 (high reliability) can be achieved without losing original advantages of the replacement sidewall process (e.g. suppression of short channel effect and improvements in drive capability).

In the first through third preferred embodiments, there is a possibility that the semiconductor substrate 31 and the gate electrode 21 might be eroded by the oxide film in the protective oxidation process. In the fourth preferred embodiment, on the other hand, the silicon film 43 is formed to raise the source and drain regions 23; therefore, only this silicon film 43 is eroded and the semiconductor substrate 31 is protected from erosion.

Further, in the first through third preferred embodiments, impurity concentrations of the source and drain regions 23 and the gate electrode 21 are reduced because high impurity concentration regions of the source and drain regions 23 and the gate electrode 21 are incorporated into the protective oxide film 38. In the fourth preferred embodiment, on the other hand, by raising the source and drain regions 23 and the gate electrode 21, impurity diffusion into the protective oxide film 38a can be suppressed and high impurity concentration can be maintained.

Also, the technique for raising the source and drain originally carries the advantage that junction leakage current and short channel effect can be suppressed. This is because the raising of the source and drain allows both the formation of sufficiently shallow junctions under the substrate surface and an increase in the distance between the junction and silicide such as Co.

While in the third preferred embodiment, the oxidation acceleration process is performed after the source and drain (impurity region) formation process, the source and drain (impurity region) formation process may be performed after execution of the oxidation acceleration process on the major surface of the semiconductor substrate 31.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:
   (a) forming a gate insulating film on a major surface of a semiconductor substrate and a gate electrode on said semiconductor substrate through said gate insulating film;
   (b) forming a dummy sidewall to cover side surfaces of said gate electrode and said gate insulating film and a predetermined area of said major surface which extends laterally from said side surfaces;
   (c) forming an impurity region by introducing an impurity into said major surface using said dummy sidewall and said gate electrode as masks;
   (d) forming a protective oxide film on said gate electrode and on said major surface using said dummy sidewall as a mask, said step (d) being performed either prior to or after said step (c);
   (e) reducing a thickness of said dummy sidewall, said step (e) being performed after said step (d); and
   (f) extending said impurity region under part of said gate insulating film using a dummy sidewall left after said step (e) and said gate electrode as masks.

2. The method according to claim 1, wherein said step (d) is performed after said step (b) and prior to said step (c).

3. The method according to claim 1, further comprising the step of:
   (g) accelerating oxidation by implanting an impurity into said gate electrode and said major surface using said dummy sidewall as a mask,
   said step (g) being performed after said step (b) and prior to said step (d).

4. The method according to claim 1, further comprising the step of:
   (h) raising said major surface by epitaxial growth using said dummy sidewall and said gate electrode as masks,
   said step (h) being performed after said step (b) and prior to said step (d),
   wherein in said step (d), a protective oxide film is formed on a structure obtained by said step (h), using said dummy sidewall as a mask.

5. The method according to claim 1, wherein
   in said step (b), said dummy sidewall is formed by depositing an oxide film of a predetermined thickness to cover side surfaces of said gate electrode and said gate insulating film and a predetermined area of said major surface which extends laterally from said side surfaces, and also depositing a nitride film to cover said oxide film, and
   in said step (e), only said nitride film is removed to reduce the thickness of said dummy sidewall.

6. The method according to claim 1, wherein
   in said step (d), annealing is performed by utilizing heat applied at the formation of said protective oxide film.

7. The method according to claim 1, wherein
   said step (f) includes the steps of:
   implanting an impurity into said impurity region; and
   performing rapid thermal annealing or annealing using a vertical diffusion furnace immediately after the impurity implantation.

8. The method according to claim 1, wherein
   said step (f) includes the steps of:
   implanting an impurity into said impurity region; and
   performing annealing for silicide formation.

9. The method according to claim 1, wherein
   said step (f) includes the step of performing solid phase diffusion in said impurity region.

10. The method according to claim 1, wherein
    said step (c) includes the steps of:
    implanting said impurity into said major surface using said dummy sidewall and said gate electrode as masks; and
    performing annealing immediately after the impurity implantation.

* * * * *